(12) United States Patent
Thiruvengadam et al.

(10) Patent No.: US 11,043,269 B2
(45) Date of Patent: Jun. 22, 2021

(54) PERFORMING A TEST OF MEMORY COMPONENTS WITH FAULT TOLERANCE

(71) Applicant: Micron Technology, Inc., Boise, ID (US)

(72) Inventors: Aswin Thiruvengadam, Folsom, CA (US); Sivagnanam Parthasarathy, Carlsbad, CA (US); Daniel Scobee, Ione, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/889,774

(22) Filed: Jun. 1, 2020

(65) Prior Publication Data
US 2020/0294587 A1    Sep. 17, 2020

Related U.S. Application Data

(63) Continuation of application No. 16/209,352, filed on Dec. 4, 2018, now Pat. No. 10,672,470.

(51) Int. Cl.
*G11C 13/00* (2006.01)
*G11C 29/12* (2006.01)
*G11C 29/56* (2006.01)

(52) U.S. Cl.
CPC ........ *G11C 13/004* (2013.01); *G11C 13/0069* (2013.01); *G11C 29/12* (2013.01); *G11C 29/56* (2013.01)

(58) Field of Classification Search
CPC ... G11C 13/0069; G11C 13/004; G11C 29/12; G11C 29/56

USPC ........................................................ 365/201
See application file for complete search history.

(56) References Cited

U.S. PATENT DOCUMENTS

| 6,960,908 B2 | 11/2005 | Chung et al. |
| 7,473,568 B2 | 1/2009 | Co et al. |
| 9,341,675 B2 * | 5/2016 | Kilian .............. G01R 31/31813 |

FOREIGN PATENT DOCUMENTS

| JP | 3067687 U | 4/2000 |
| JP | 2000258496 A | 9/2000 |
| KR | 20180001918 A | 1/2018 |

OTHER PUBLICATIONS

PCT International Search Report and Written Opinion for International Application No. PCT/US2019/064414 dated Mar. 26, 2020, 9 pages.

* cited by examiner

*Primary Examiner* — Son L Mai
(74) *Attorney, Agent, or Firm* — Lowenstein Sandler LLP

(57) ABSTRACT

Test resources of a test platform that are performing a test of memory components are determined. An indication that a particular test resource of the test resources of the test platform has failed can be received. The particular test resource is failed while performing a portion of the test of memory components. A remaining portion of the test of memory components can be performed based on the indication that the particular test resource of the test platform has failed.

20 Claims, 7 Drawing Sheets

PERFORMING A TEST OF MEMORY COMPONENTS WITH FAULT TOLERANCE

RELATED APPLICATIONS

This application is a continuation application of co-pending U.S. patent application Ser. No. 16/209,352, filed Dec. 4, 2018, which is herein incorporated by reference.

TECHNICAL FIELD

The present disclosure generally relates to a memory sub-system, and more specifically, relates to performing a test of memory components with fault tolerance for the memory components of memory sub-systems.

BACKGROUND

A memory sub-system can be a storage system, such as a solid-state drive (SSD), or a hard disk drive (HDD). A memory sub-system can be a memory module, such as a dual in-line memory module (DIMM), a small outline DIMM (SO-DIMM), or a non-volatile dual in-line memory module (NVDIMM). A memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various implementations of the disclosure.

DETAILED DESCRIPTION

Figure 1:
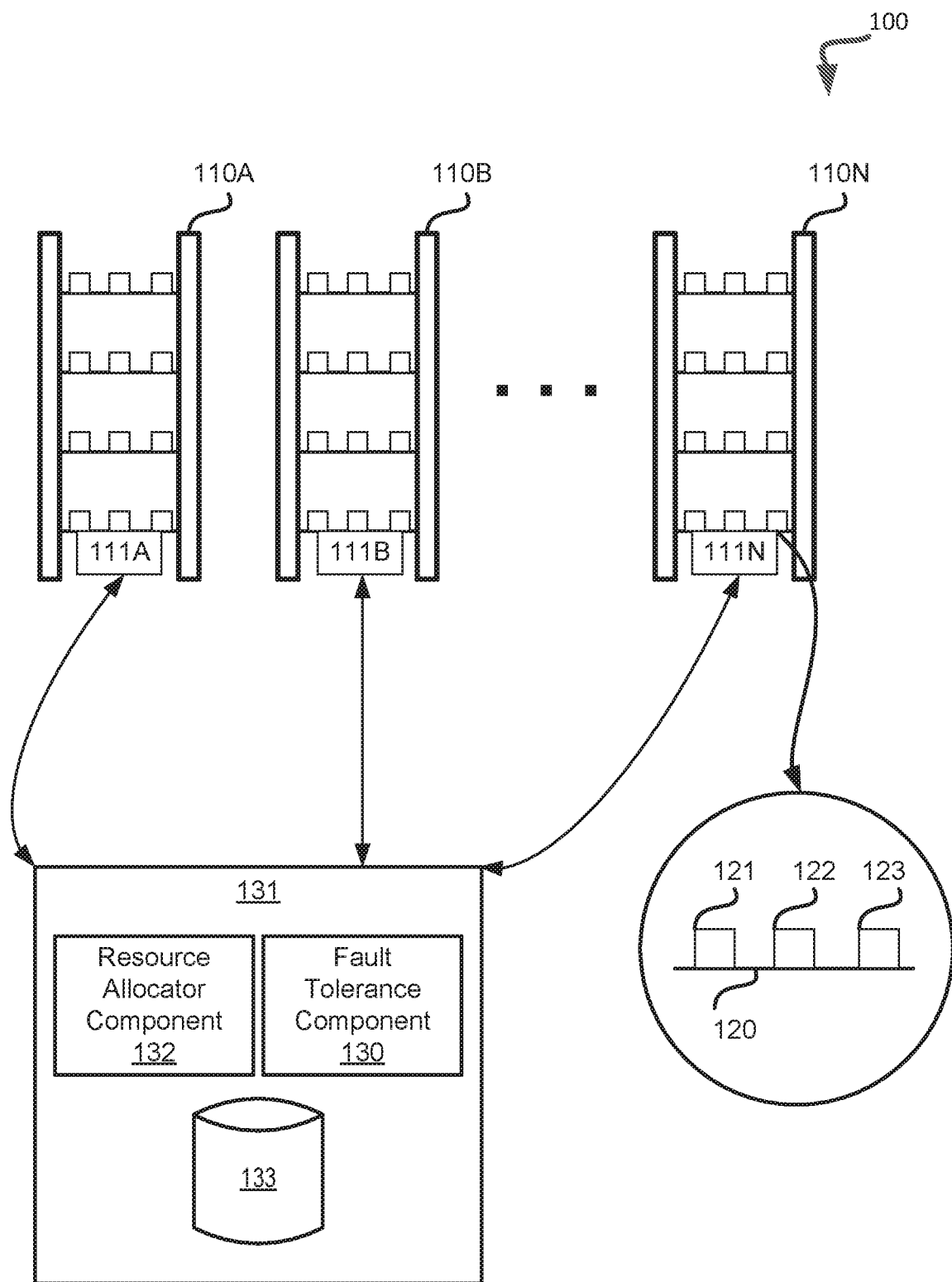
FIG. 1 illustrates an example environment to perform a test of memory components with fault tolerance of a portion of the test in accordance with some embodiments of the present disclosure.

Aspects of the present disclosure are directed to performing a test of memory components with fault tolerance. A memory sub-system is also hereinafter referred to as a "memory device." An example of a memory sub-system is a storage device that is coupled to a central processing unit (CPU) via a peripheral interconnect (e.g., an input/output bus, a storage area network). Examples of storage devices include a solid-state drive (SSD), a flash drive, a universal serial bus (USB) flash drive, and a hard disk drive (HDD). Another example of a memory sub-system is a memory module that is coupled to the CPU via a memory bus. Examples of memory modules include a dual in-line memory module (DIMM), a small outline DIMM (SO-DIMM), a non-volatile dual in-line memory module (NVDIMM), etc. The memory sub-system can be a hybrid memory/storage sub-system. In general, a host system can utilize a memory sub-system that includes one or more memory components. The host system can provide data to be stored at the memory sub-system and can request data to be retrieved from the memory sub-system.

The memory components that are used in a memory sub-system can be tested before being utilized in the memory sub-system. In a conventional test process, the memory components can be placed into a chamber (i.e., an oven) that tests the memory components under various temperature conditions. For example, a single chamber can be used to test multiple memory components at a single time at a particular temperature. The test process can instruct various operations to be performed at the memory components at the particular temperature. Such operations can include, but are not limited to, read operations, write operations, and erase operations. The performance and behavior of the memory components can be observed while the test process is performed. For example, performance characteristics (e.g., read or write latencies) and reliability of data stored at the memory components can be measured and recorded during the test process. However, since the chamber can only apply a single temperature to the memory components at any particular time, the testing of the memory components at many different temperatures can require a large amount of time as the test process will need to be performed for each desired temperature. Additionally, the chamber can only perform a single test process at a time. As such, performing different tests of the memory components at different operating conditions (e.g., different temperatures) can utilize a large amount of time if many different conditions of the test process for the memory components are desired.

Aspects of the present disclosure address the above and other deficiencies by performing a test of memory components with fault tolerance of a portion of the test. The test of the memory components can be performed by a distributed test platform that includes multiple test resources. Each test resource of the test platform can be a test socket that includes a memory component that can be utilized by the test and a temperature control component that is used to apply a particular temperature condition to the memory component as part of the test. The test platform can further include multiple test boards that each includes one or more of the test sockets. The test boards can be organized into groups or racks and multiple racks can be at a particular location or site. As such, the test platform can include multiple test sockets.

The test can specify to use a number of the test sockets that include memory components along with a sequence of operations that are to be performed with the tested memory components and the temperature condition that is to be applied to the memory components during the test. Furthermore, the test sockets that are used to perform the test can be distributed throughout multiple test boards, test racks, and/or locations of the test platform. Thus, for a particular test of memory components, the memory components used in the test can be embedded at different test sockets at different locations. If a particular test socket fails (i.e., malfunctions) during the operation of the test of the memory components, then the portion of the test that was being performed by the failed test socket can be incomplete. For example, data specifying the performance characteristics, reliability of data, or other such observations of the memory component being tested at the failed test socket can be incomplete. In response to the test socket failing, the test platform can assign a new test socket to be allocated for use by the test in order to complete the portion of the test that was being performed by the failed test socket. For example, the test platform can identify another memory component that is available at an unused test socket. Such a test socket can be referred to as an available test socket which is a test socket that is not currently being used by the test of memory components or by another separate test of memory components that is concurrently being performed at the test platform. The test platform can determine whether another memory component at an available test socket matches characteristics of the memory component that was included in the test socket that failed. Such characteristics can be prior usage characteristics, design information, or other such information of a memory component. If the other memory component at the available test socket matches the characteristics of the memory component at the failed test socket, then the test platform can initiate the portion of the test at the new test socket with the other memory component. For example, the portion of the test that was being performed at the failed test socket can be replicated at the new test socket. The operations and temperature condition can then be applied to the new test socket to complete the portion of the test. Subsequently, the test platform can combine the results of the portion of the test from the failed test socket (e.g., before the failure occurred) and the new test socket. In some embodiments, the new test socket can perform the portion of the test and the results can be retrieved from the new test socket without retrieving any data from the failed test socket.

In some embodiments, the test platform can provide an alert notification when a test socket has failed. For example, when a test socket has failed, the test rack that includes the test board with the failed test socket can transmit a notification that indicates that the test socket has failed. The failure of the test socket can result in a pausing of the portion of the test that was being performed by the failed test socket. Once the failure of the test socket has been resolved (e.g., the test socket or test board is replaced), then the test platform can resume the performance of the portion of the test at the replaced test socket.

The test platform can further pause a first portion of the test at a first test socket based on a failure of a second test socket. The first portion of the test can be dependent on a result of a second portion of the test that was being performed at the second test socket. For example, the first portion of the test can specify that particular operating conditions (e.g., operations to be performed and/or an applied temperature condition) are to be applied at the memory component of the first test socket based on the results of the second test socket. If the second test socket fails, then the test platform can also pause the first test socket as the first test socket is to operate based on results of the second test socket. Subsequently, the test platform can resume the first portion of the test when the failure of the second test socket has been resolved.

Advantages of the present disclosure include, but are not limited to, a decrease in the amount of time that is used to perform tests of the memory components. For example, the testing of the memory components can utilize a period of time and if a particular portion of the test platform fails while performing the test, the test platform can pause a portion of the test that failed while other portions of the test at other portions of the test platform can continue to operate. As a result, the entire test of memory components does not need to be restarted if a portion of the test fails at one of the memory components. Thus, the resources of the test platform can also be utilized to perform more tests of memory components as the resources of the test platform can be more available to perform additional tests of memory components as opposed to repeating portions of a test of memory components that had failed during execution of the test.

FIG. 1 illustrates an example environment to allocate test resources to perform a test of memory components in accordance with some embodiments of the present disclosure. A test platform 100 can include one or more racks 110A, 110B, and 110N. Each of the racks 110A, 110B, and 110N can include multiple test boards 120 where each test board 120 includes one or more test sockets (i.e., test resources). The test platform 100 can include any number of racks or test sockets.

As shown, a test board 120 can include one or more test sockets. For example, a test board 120 can include a first test socket 121, a second test socket 122, and a third test socket 123. Although three test sockets are shown, a test board 120 can include any number of test sockets. Each test socket can include a memory component that has been embedded within the respective test socket. Additionally, each test socket can include a temperature control component that is used to apply a temperature condition to the embedded memory component. In some embodiments, the temperature control component can be a dual Peltier device (e.g., two Peltier devices) that utilize a Peltier effect to apply a heating or cooling effect at a surface of the dual Peltier device that is coupled to the embedded memory component. In the same or alternative embodiments, the temperature control component can be placed on top of the memory component in the respective test socket.

As shown, each test rack 110A, 110B, and 110N can include multiple test boards 120. Each of the test boards 120 of a particular test rack can be coupled with a local test component. For example, each test rack 110A, 110B, and 110N can respectively include a local test component 111A, 111B, and 111N. Each of the local test components 111A, 111B, and 111N can receive instructions to perform a test or a portion of a test that is to be performed at the test sockets of the respective test rack. For example, a resource allocator component 132 can receive (e.g., from a user) conditions of the test that is to be performed and the resource allocator component 132 can determine particular test sockets across the different test boards 120 at one or more of the test racks 110A, 110B, and 110N that can be used by the test. In some embodiments, the resource allocator component 132 can be provided by a server 131. In some embodiments, the server 131 is a computing device or system that is coupled with the local test components 111A, 111B, and 111N over a network.

The temperate control component of each test socket 121, 122, and 123 of each test board 120 can be used to apply a different temperature condition to the respective embedded memory component. Furthermore, each test socket 121, 122, and 123 can be used to perform different operations at the embedded memory components.

The resource allocator component 132 can receive a test input from a user. The test input can specify conditions of the test that is to be performed with one or more memory components. For example, the test can specify particular temperature conditions that are to be applied to memory components and a sequence of operations that are to be performed at memory components under particular temperature conditions. The resource allocator 132 can retrieve a data structure or database 133 that includes test resource data that identifies available test sockets across the test platform 100 as well as characteristics of the available test sockets. The database 133 can include usage characteristics and design information of the memory components that can be used to assign the test resources to a test. The resource allocator component 130 can assign test sockets at the test platform 100 that include embedded memory components that match or satisfy the conditions of the test. The resource allocator component 133 can then transmit instructions to local test components of test racks that include test sockets that are to be used in the test. Additionally, the resource allocator component 133 can receive test results from the different test sockets.

The test platform 100 can further include a fault tolerance component 130 that is used to provide fault tolerance for a test that is being performed at the test resources of the test platform 100. For example, the fault tolerance component 130 can receive an indication of a test resource (i.e., a test socket) that has failed and has become unable to complete a portion of a test being performed at various test resources of the test platform 100. The fault tolerance component 130 can pause the test or restart the portion of the test at another test resource based on the indicated failure. Further details with respect to the fault tolerance component 130 are described below.

Figure 2:
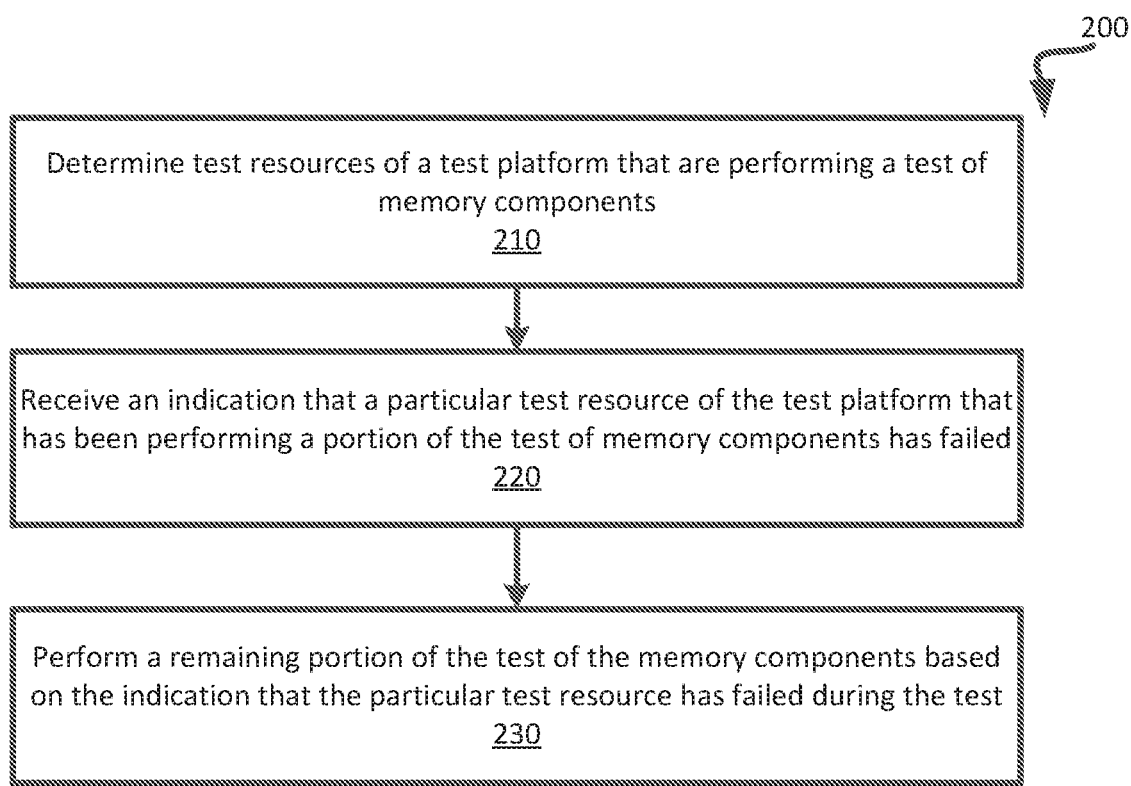
FIG. 2 is a flow diagram of an example method to perform a test of memory components in accordance with some embodiments of the present disclosure.

FIG. 2 illustrates an example method 200 to perform a test of memory components in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the fault tolerance component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 210, the processing logic determines test resources of a test platform that are performing a test of memory components. For example, a data structure can be retrieved where the data structure identifies the test resources that are present at the test platform. The data structure can specify each test resource, characteristics of memory components at each test resource, locations of the test resources, indications of whether particular test resources are being used by a particular test and whether other test resources are being used by other tests of memory components at the test platform. At operation 220, the processing logic receives an indication that a particular test resource of the test platform that has been performing a portion of the test of memory components has failed. A test resource can be considered to fail when the test resource cannot complete a portion of a test that has been scheduled to be performed or was being performed at the test resource. For example, the test resource can fail if a test board that includes the test resource becomes unable to transmit operations to be performed at the memory component. Thus, the test resource can be considered to fail if the test board that includes the test resource has failed. The test resource can additionally be considered to fail if the memory component embedded within the test resource becomes corrupted or if the temperature control element of the test resource is not capable of applying the requested temperature condition to the memory component included in the test resource.

As shown in FIG. 2, at operation 230, the processing logic performs a remaining portion of the test of the memory components based on the indication that the particular test resource has failed during the test. For example, the portion of the test that was being performed at the failed test resource can be paused while other portions of the test being performed at other test resources can still be performed. In some embodiments, another test resource that is not currently being used by another test and that matches characteristics of the memory component of the failed test resource can be used to perform the remaining portion of the test. Further details with respect to performing the remaining portion of the test at another test resource are described in conjunction with FIG. 3. In some embodiments, the failure of the test resource can result in a pausing of another test resource until the failed test resource has been replaced. For example, another test resource can be paused if the other test resource is dependent on results of the failed test resource. Further details with respect to pausing a test resource based on a dependency are described in conjunction with FIG. 5.

Figure 3:
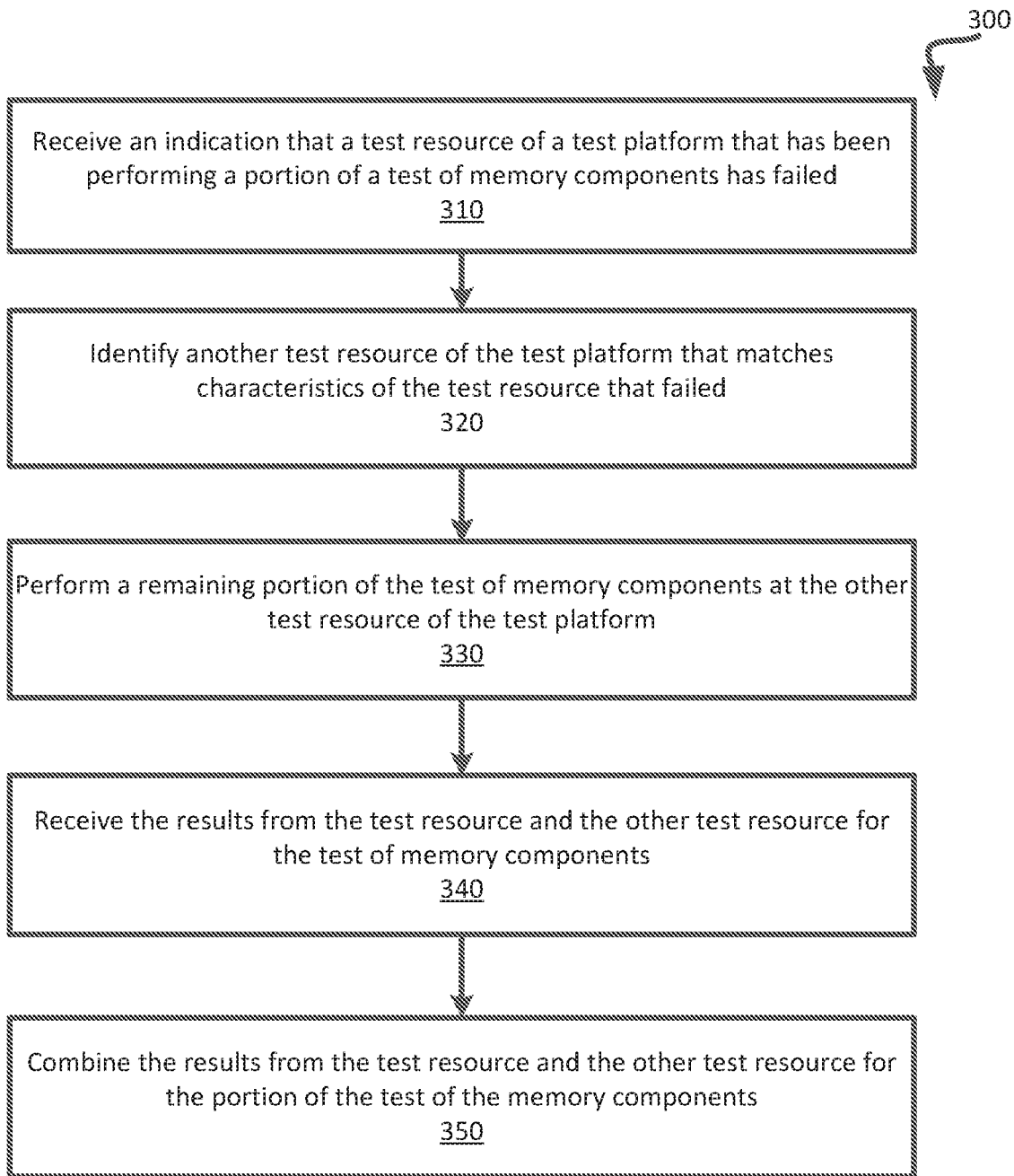
FIG. 3 is a flow diagram of an example method to perform a test of memory components by initiating a portion of the test at a new test resource based on a failure of another test resource in accordance with some embodiments.

FIG. 3 is a flow diagram of an example method 300 to perform a test of memory components by initiating a portion of the test at a new test resource based on a failure of another test resource in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the fault tolerance component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 310, the processing logic receives an indication that a test resource of a test platform that has been performing a portion of a test of memory components has failed. For example, a test board that includes the test resource or a test rack that includes the test board can transmit a notification that the test resource has failed. The test resource can be a single test resource out of multiple test resources that are being used to perform the test of memory components. In some embodiments, the notification can identify the particular test that has failed and can identify a location of the test resource that failed. For example, when a user provides inputs to have a test performed at the test platform, the user can provide a name or other such identification for the test. The notification can thus include the identification of the test. Furthermore, the notification can specify the location, test rack, and test board that include the specific test resource (i.e., test socket) that failed.

At operation 320, the processing logic identifies another test resource of the test platform that matches characteristics of the test resource that failed. The characteristics of the test resource can be usage characteristics of the memory component that is included in the failed test resource. For example, the usage characteristics can specify a number of operations that have been performed on the memory component of the test resource that failed. In some embodiments, the usage characteristics can a specify a number of program-erase operations or cycles and a particular number of read operations that have been performed on the memory component during the test and any prior tests. In some embodiments, the usage characteristics can specify the prior temperature conditions that have been applied to the memory component during the use of the memory component in the test and prior tests. For example, the prior temperatures at which operations have been performed at the memory component for prior tests can be specified (i.e., a temperature profile of the memory component). Thus, the characteristics can be based on a usage history of the memory component. In some embodiments, the characteristics can specify a type of the memory component that is included in the failed test resource. For example, particular versions (i.e., design or manufacturing revisions) of the memory component can be specified.

The matching test resource can be a test resource of the test platform that is not currently being used by any test at the test platform. For example, the matching test resource can be a test resource with a memory component that matches the characteristics of the memory component included in the failed test resource and is not currently being used by the test or another test at the test platform.

As shown in FIG. 3, at operation 330, the processing logic performs a remaining portion of the test of memory components at the other test resource of the test platform. For example, the portion of the test that was not completed as a result of the failure of the test resource can be performed at the other test resource. In some embodiments, when the test resource fails, the test resource (or the test board that includes the test resource) can provide an indication of the portion of the test allocated to the test resource that had completed and the remaining portion of the test allocated to the test resource that had not completed. For example, the portion of the test allocated to the test resource can be to perform a sequence of operations on the included memory component at one or more temperatures. The indication can identify which of the operations at requested temperatures have been performed and which of the operations at requested temperatures have not been performed. For example, the indication can identify the last operation in the sequence of operations allocated to the test resource that has been performed. The subsequent operations in the sequence of operations can then be performed at the requested one or more temperatures at the memory component included in the other test resource.

At operation 340, the processing logic receives the results from the test resource and the other test resource for the test of memory components. For example, the results of the portion of the test that were performed by the failed test resource and the results of the remaining portion of the test that were performed by the other test resource can be received from the respective test resources. At operation 350, the processing logic combines the results from the test resource and the other test resource for the portion of the test of the memory components. For example, the results of the portion of the sequence of operations performed at the test resource before failure can be combined with the remaining portion of the sequence of operations performed at the other test resource.

In some embodiments, the portion of the test that was performed by the failed test resource can be performed from the beginning at the new test resource (i.e., the other test resource). For example, the entire sequence of operations can be performed at the new test resource at the one or more requested temperatures. Thus, the sequence of operations that was to be performed at the failed test resource can be performed at the new test resource.

Figure 4A:
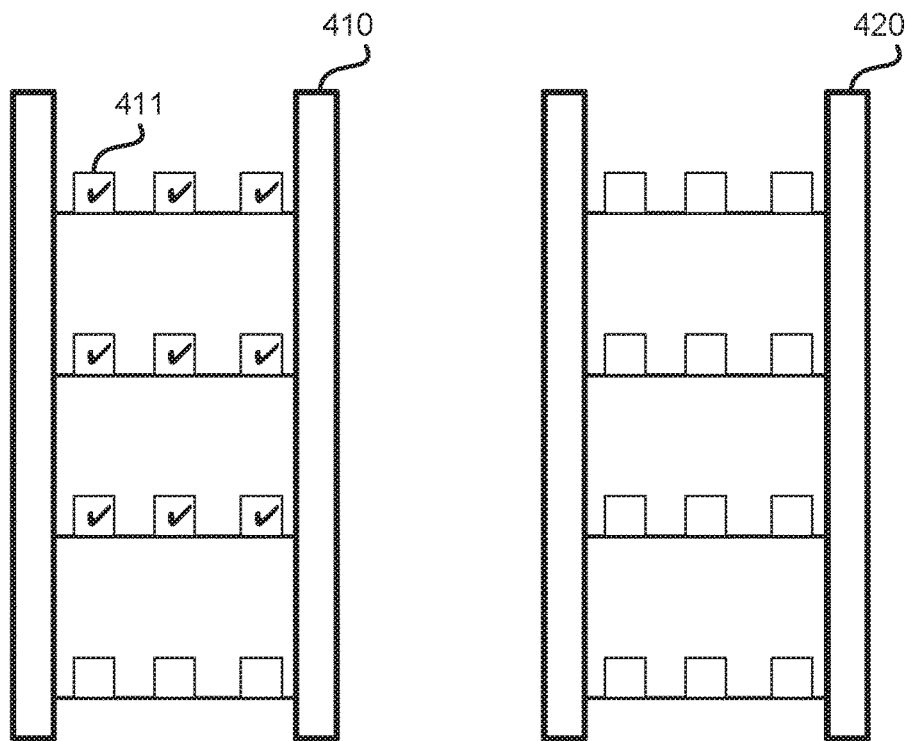
FIG. 4A illustrates the allocation of test resources to perform a test of memory components in accordance with some embodiments of the present disclosure.

FIG. 4A illustrates the allocation of test resources to perform a test of memory components in accordance with some embodiments of the present disclosure. The test resources can be allocated by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the test resources can be allocated by the fault tolerance component 130 of FIG. 1.

As shown, a test of memory components can be performed at a test platform that includes test racks 410 and 420. For example, the test resources 411 with the checkmark can indicate test resources that are currently being used to perform the test of the memory components. The test resources without the checkmark indicate test resources that are currently available and not being used by any test at the test platform.

Figure 4B:
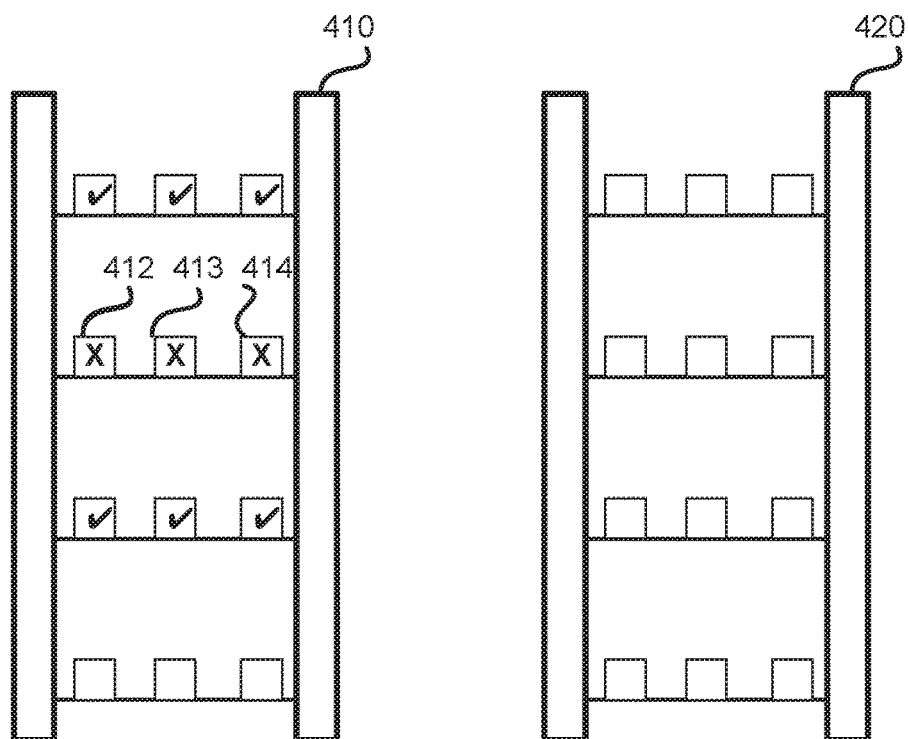
FIG. 4B illustrates the test of memory components where a portion of the test has failed in accordance with some embodiments of the present disclosure.

FIG. 4B illustrates the test of memory components where a portion of the test has failed in accordance with some embodiments of the present disclosure. As shown, a failure of the test resources 412, 413, and 414 can occur. In some embodiments, the failure of the test resources 412, 413, and 414 can be the test board that includes the test resources 412, 413, and 414 failing as a result of a physical malfunction of the test board, a network connection of the test board failing, etc. As a result, the failure of the test board can result in a failure of each of the test resources 412, 413, and 414 that are located on the test board. In some embodiments, an individual test resource can fail. For example, a particular test resource can be considered to fail if the temperature control element of the test resource cannot apply the requested temperature condition to the included memory component of the test resource. The other test resources (e.g., as indicated by the checkmark) that were performing other portions of the test can still be performing the test.

Figure 4C:
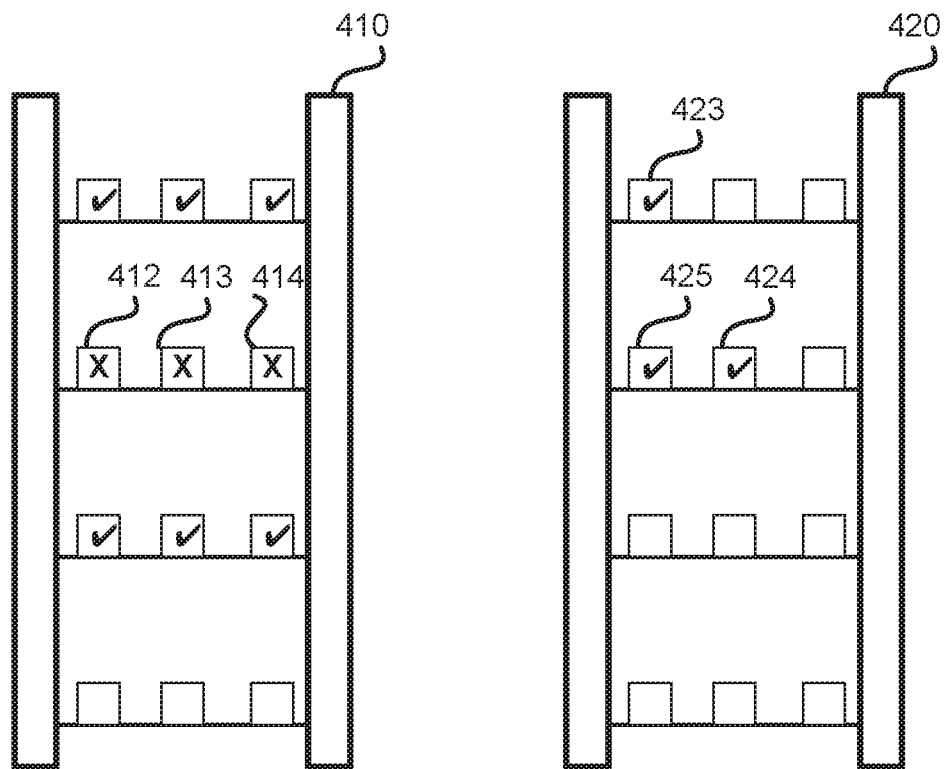
FIG. 4C illustrates the test of memory components where the portion of the test that failed has been restarted at a new test resource in accordance with some embodiments of the present disclosure.

FIG. 4C illustrates the test of memory components where the portion of the test that failed has been restarted at a new test resource in accordance with some embodiments of the present disclosure. As shown, the portion of the test that was being performed at the failed test resources 412, 413, and 414 can be restarted at new test resources 423, 424, and 425. The new test resources 423, 424, and 425 can perform the sequence of operations that was allocated to the failed test resources 412, 413, and 414 or can perform the remaining operations of the sequence of operations that had not been performed when the test resources 412, 413, and 414 had failed.

In some embodiments, the new test resources can be selected to be in a new test rack that is separate from the test rack that includes the failed test resources. In some embodiments, the new test resources can be selected based on a location of the failed test resources. For example, the new test resources can be test resources that match the failed test resources and that are at the same test racks or closer locations to the failed test resources.

Figure 5:
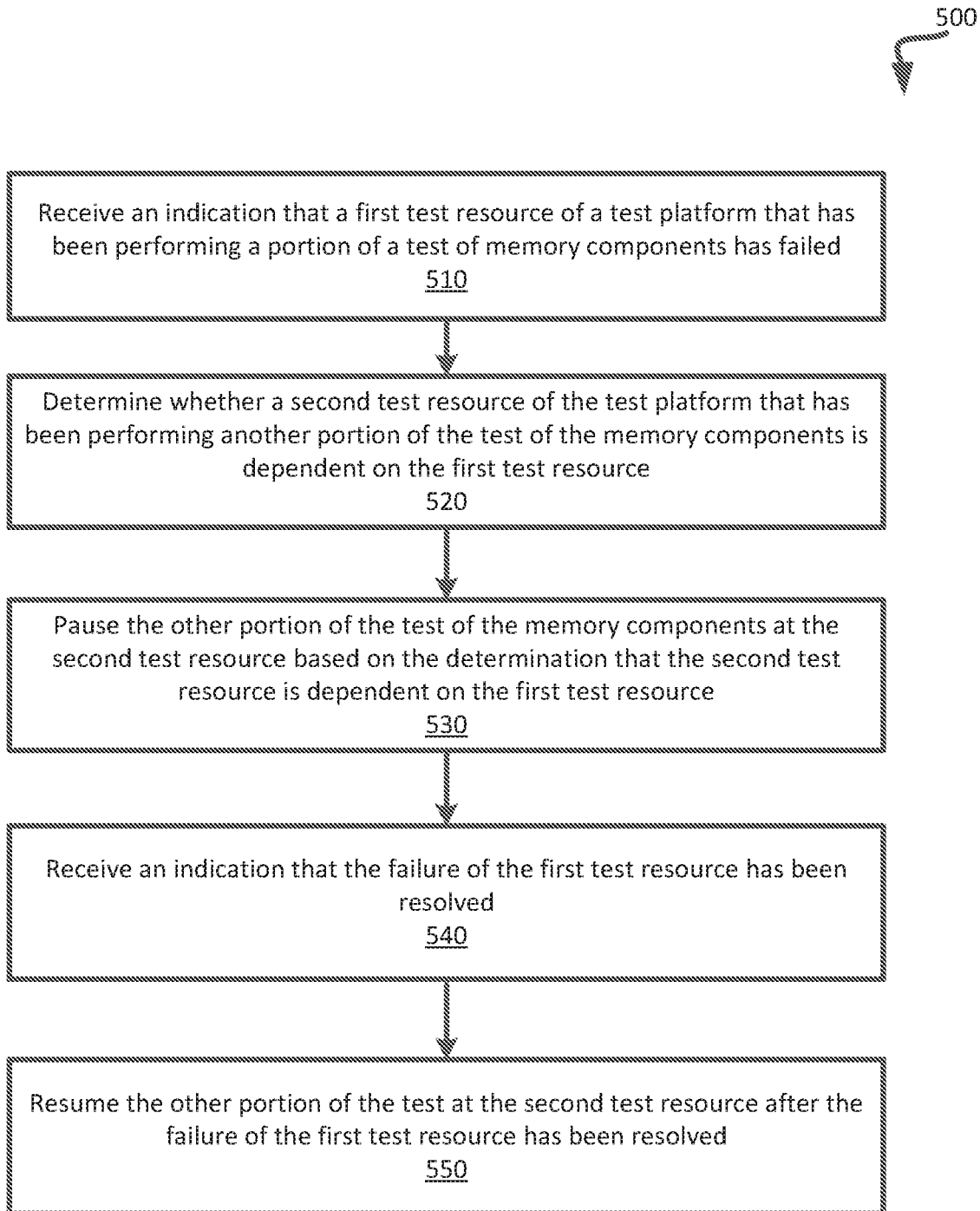
FIG. 5 is a flow diagram of an example method to perform a test of memory components based on dependences between test resources in accordance with some embodiments.

FIG. 5 is a flow diagram of an example method 500 to perform a test of memory components based on dependences between test resources in accordance with some embodiments. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the fault tolerance component 130 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown, at operation 510, the processing logic receives an indication that a first test resource of a test platform that has been performing a portion of a test of memory components has failed. For example, the indication can identify that the first resource cannot complete the sequence of operations that have been allocated to the first test resource. The indication can identify a particular operation of the sequence of operations that was the last operation that the first resource had performed. At operation 520, the processing logic determines whether a second test resource of the test platform that has been performing another portion of the test of the memory components is dependent on the first test resource. A dependency between the first test resource and the second test resource can be that the performance of the portion of the test at the second test resource is based on one or more results of the first test resource. For example, the second test resource can specify that a particular operation (e.g., a read operation, write operations, or erase operation) at a particular temperature is to be performed based on how the memory component of the first test resource performs a defined operation at a defined temperature. Thus, a particular operation to be performed and/or a particular temperature condition to be applied at the second test resource can be based on a result of the behavior or operation of the memory component included at the first test resource. As such, the second test resource can be considered dependent upon the first test resource.

In some embodiments, the dependency can be based on the results of a test at test resources. For example, various settings (i.e., trims) can be set or defined for a memory component where the different settings can influence the operation and behavior of the memory component. For example, a particular setting that is defined for the memory component can change the functionality, reliability, and performance of the memory component. The settings or trims of the memory component can be updated or changed. In some embodiments, a test can be performed on multiple test resources by iteratively modifying the settings or trims of the memory components at the test resources. For example, a first portion of the test can be performed at a first test resource with a memory component at a first setting and a second portion of the test can be performed at a second test resource with another memory component at a second setting, etc. The results from the test at each of the memory components can then be combined to determine new settings for the memory components that are to be performed at a next test or a subsequent portion of the test. Thus, a test resource can be dependent on another test resource when the results of each of the test resources are used to perform a subsequent test based on a setting or trim that is based on the results of the test performed at the test resources.

In some embodiments, a test resource can be dependent on another test resource when a same type of test is being performed at the test resources. For example, the test can perform similar operations at similar conditions at test resources that include memory components with similar characteristics. If one of the test resources of the test detects an anomaly or a failure such as a type of behavior of the memory component that is unexpected, then another test resource performing the same test can be paused. In some embodiments, the test board with the test resource that detected the anomaly can transmit an interrupt or instruction to the other test resource to pause the portion of the test at the other test resource. In some embodiments, after the other test resource is paused, an action can be performed at the test resource. Such an action can be a measurement of a characteristic or observation of the state of the other test resource before the sequence of events that caused the anomaly to appear at the prior test resource are performed at the other test resource.

At operation 530, the processing logic pauses the other portion of the test at the second test resource based on the determination that the second test resource is dependent on the first test resource. For example, an instruction can be transmitted to the second test resource to pause the performance of the portion of the test that was being performed at the second test resource. The instruction can indicate that the first test resource that the second test resource is dependent upon has failed. In some embodiments, the instruction can indicate a particular operation of the sequence of operations at the second test resource where the second test resource is to be paused. For example, the instruction can indicate the point in the sequence of operations that the second test resource is to pause and not perform subsequent operations of the sequence of operations. At operation 540, the processing logic receives an indication that the failure of the first test resource has been resolved. For example, the indication can identify that the first test resource has resumed the portion of the test allocated to the first test resource. In some embodiments, the resolving of the failure can be that the portion of the test allocated to the first test resource has been restarted or resumed at a new test resource as previously identified. In some embodiments, the indication can specify a difference between the first test resource and the new test resource that has replaced the first test resource. The difference can specify a difference between the usage characteristics of the first test resource and the second test resource. The second test resource can then use the difference between usage characteristics to adjust the performance of the test at the second test resource. For example, a different temperature or an increased number of operations can be performed at the second test resource. At operation 550, the processing logic resumes the other portion of the test at the second test resource after the failure of the first test resource has been resolved. For example, an indication can be transmitted to the second test resource to resume the remaining portion of the test allocated to the second test resource.

Figure 6:
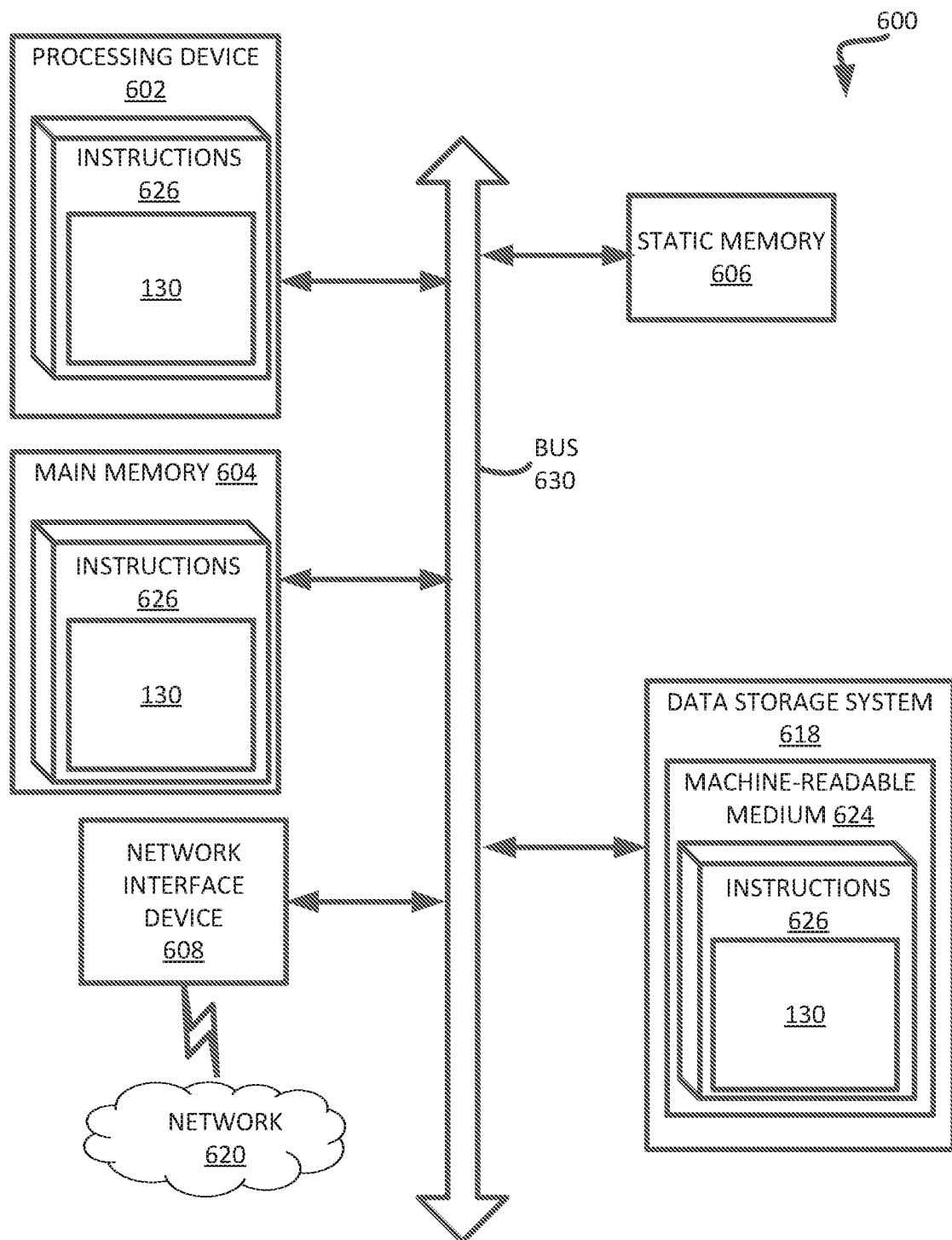
FIG. 6 is a block diagram of an example computer system in which implementations of the present disclosure can operate.

FIG. 6 illustrates an example machine of a computer system 600 within which a set of instructions, for causing the machine to perform any one or more of the methodologies discussed herein, can be executed. In some embodiments, the computer system 600 can correspond to a host or server system that includes, is coupled to, or utilizes a test platform (e.g., to execute operations corresponding to the fault tolerance component 130 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 600 includes a processing device 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a data storage system 618, which communicate with each other via a bus 630.

Processing device 602 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. The processing device 602 is configured to execute instructions 626 for performing the operations and steps discussed herein. The computer system 600 can further include a network interface device 608 to communicate over the network 620.

The data storage system 618 can include a machine-readable storage medium 624 (also known as a computer-readable medium) on which is stored one or more sets of instructions 626 or software embodying any one or more of the methodologies or functions described herein. The instructions 626 can also reside, completely or at least partially, within the main memory 604 and/or within the processing device 602 during execution thereof by the computer system 600, the main memory 604 and the processing device 602 also constituting machine-readable storage media. The machine-readable storage medium 624, data storage system 618, and/or main memory 604 can correspond to a memory sub-system.

In one embodiment, the instructions 626 include instructions to implement functionality corresponding to a fault tolerance component (e.g., the fault tolerance component 130 of FIG. 1). While the machine-readable storage medium 624 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining a plurality of test resources of a test platform that are performing a test of memory components;
   receiving an indication that a particular test resource of the plurality of test resources of the test platform has failed, wherein the particular test resource has failed while performing a portion of the test of memory components; and
   performing, by a processing device, a remaining portion of the test of memory components based on the indication that the particular test resource of the test platform has failed.

2. The method of claim 1, wherein performing the remaining portion of the test of memory components comprises:
   determining a characteristic of the particular test resource; and
   identifying another test resource of the test platform based on the characteristic of the particular test resource, wherein the remaining portion of the test of memory components is performed based on the another test resource.

3. The method of claim 2, wherein:
   the particular test resource comprises a memory component;
   the characteristic of the particular test resource corresponds to a usage characteristic of the memory component of the particular test resource; and
   the identifying of the another test resource of the test platform based on the characteristic of the particular test resource comprises determining that a usage characteristic of another memory component of the another test resource matches the usage characteristic of the memory component of the particular test resource.

4. The method of claim 2, wherein the test corresponds to a sequence of operations performed at the memory component, and wherein the performing of the remaining portion of the test of memory components:
   determining a last performed operation of the sequence of operations that was performed at the particular test resource before the failure of the particular test resource; and
   performing one or more additional operations subsequent to the last performed operation of the sequence of operations at another memory component of the another test resource.

5. The method of claim 2, further comprising:
   receiving results of the remaining portion of the test of memory components performed at the particular test resource before the failure of the particular test resource; and
   receiving additional results of the remaining portion of the test of memory components performed at the another test resource after the failure of the particular test resource.

6. The method of claim 2, wherein the characteristic of the particular test resource indicates at least one of a number of prior operations that have been performed at the particular test resource, or a prior temperature condition that has been applied to the particular test resource.

7. The method of claim 1, wherein performing the remaining portion of the test of memory components comprises:
   upon receiving the indication that the particular test resource has failed while performing the portion of the test of memory components, determining whether a second test resource of the test platform that has been performing the remaining portion of the test of memory components is dependent on the particular test resource of the test platform; and
   in response to determining that the second test resource is dependent on the particular test resource, pausing a performance of the remaining portion of the test by the second test resource of the test platform.

8. The method of claim 7, wherein determining whether the second test resource is dependent on the first test resource comprises:
   determining whether a result of the portion of the test performed by the particular test resource is used by the second test resource to perform the remaining portion of the test.

9. The method of claim 8, wherein the result of the portion of the test specifies at least one of:
   a particular temperature condition that is to be applied to a particular memory component of the second test resource,
   a particular operation that is to be performed at a particular memory component of the second test resource, or
   a behavior of a particular memory component included in the particular test resource in response to a particular operation performed on the particular memory component at a particular temperature condition.

10. The method of claim 7, further comprising:
    receiving an indication that the failure of the particular test resource has been resolved; and
    providing an instruction to resume the performance of the remaining portion of the test by the second test resource of the test platform.

11. A non-transitory computer readable medium comprising instructions, which when executed by a processing device, cause the processing device to perform operations comprising:
    determining a plurality of test resources of a test platform that are performing a test of memory components;
    receiving an indication that a particular test resource of the plurality of test resources of the test platform has failed, wherein the particular test resource has failed while performing a portion of the test of memory components; and
    performing a remaining portion of the test of memory components based on the indication that the particular test resource of the test platform has failed.

12. The non-transitory computer readable medium of claim 11, wherein performing the remaining portion of the test of memory components comprises:
    determining a characteristic of the particular test resource; and
    identifying another test resource of the test platform based on the characteristic of the particular test resource, wherein the remaining portion of the test of memory components is performed based on the another test resource.

13. The non-transitory computer readable medium of claim 12, wherein the particular test resource comprises a memory component, and wherein the characteristic of the particular test resource corresponds to a usage characteristic of the memory component of the particular test resource.

14. The non-transitory computer readable medium of claim 13, wherein the identifying of the another test resource of the test platform based on the characteristic of the particular test resource comprises determining that a usage characteristic of another memory component of the another test resource matches the usage characteristic of the memory component of the particular test resource.

15. The non-transitory computer readable medium of claim 12, wherein the test corresponds to a sequence of operations performed at the memory component, and wherein the performing of the remaining portion of the test of memory components:
   determining a last performed operation of the sequence of operations that was performed at the particular test resource before the failure of the particular test resource; and
   performing one or more additional operations subsequent to the last performed operation of the sequence of operations at another memory component of the another test resource.

16. The non-transitory computer readable medium of claim 12, wherein the operations further comprise:
   receiving results of the remaining portion of the test of memory components performed at the particular test resource before the failure of the particular test resource; and
   receiving additional results of the remaining portion of the test of memory components performed at the another test resource after the failure of the particular test resource.

17. The non-transitory computer readable medium of claim 12, wherein the characteristic of the particular test resource indicates at least one of a number of prior operations that have been performed at the particular test resource, or a prior temperature condition that has been applied to the particular test resource.

18. The non-transitory computer readable medium of claim 11, wherein performing the remaining portion of the test of memory components comprises:
   upon receiving the indication that the particular test resource has failed while performing the portion of the test of memory components, determining whether a second test resource of the test platform that has been performing the remaining portion of the test of memory components is dependent on the particular test resource of the test platform; and
   in response to determining that the second test resource is dependent on the particular test resource, pausing a performance of the remaining portion of the test by the second test resource of the test platform.

19. The non-transitory computer readable medium of claim 18, wherein determining whether the second test resource is dependent on the first test resource comprises:
   determining whether a result of the portion of the test performed by the particular test resource is used by the second test resource to perform the remaining portion of the test.

20. A system comprising:
a memory component; and
a processing device, operatively coupled with the memory component, to perform operations comprising:
   determining a plurality of test resources of a test platform that are performing a test of memory components;
   receiving an indication that a particular test resource of the plurality of test resources of the test platform has failed, wherein the particular test resource has failed while performing a portion of the test of memory components; and
   performing a remaining portion of the test of memory components based on the indication that the particular test resource of the test platform has failed.

* * * * *